United States Patent
Wu

(10) Patent No.: US 7,651,341 B2
(45) Date of Patent: Jan. 26, 2010

(54) CIRCUIT BOARD ASSEMBLY WITH STAGGERED CABLE ARRANGEMENT

(75) Inventor: Jerry Wu, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/080,333

(22) Filed: Apr. 2, 2008

(65) Prior Publication Data

US 2009/0253292 A1 Oct. 8, 2009

(51) Int. Cl.
H01R 12/00 (2006.01)
(52) U.S. Cl. ............................ 439/76.1; 439/581
(58) Field of Classification Search ............... 439/76.1, 439/578–581, 638
See application file for complete search history.

(56) References Cited

U.S. PATENT DOCUMENTS

| | | | |
|---|---|---|---|
| 5,219,294 A | 6/1993 | Marsh et al. | |
| 6,585,528 B1 * | 7/2003 | Lin et al. | 439/76.1 |
| 6,739,910 B1 | 5/2004 | Wu | |
| 6,790,089 B2 * | 9/2004 | Wu | 439/608 |
| 7,134,914 B1 | 11/2006 | Wu | |
| 7,281,938 B1 * | 10/2007 | Wu | 439/353 |
| 2005/0003707 A1 * | 1/2005 | Wu | 439/579 |

OTHER PUBLICATIONS

"PCI Express External Cabling Specification, Version 1.0" published on Dec. 6, 2005 by PCI-SIG.

* cited by examiner

*Primary Examiner*—Edwin A. Leon
*Assistant Examiner*—Vanessa Girardi
(74) *Attorney, Agent, or Firm*—Wei Te Chung; Andrew C. Chang; Ming Chieh Chang

(57) ABSTRACT

A cable assembly (100) includes a housing (10) consisted of a first shield part (1) assembled to a second shield part (2) to form a receiving space, said receiving space including a hollow portion (110) and a mating port (120) located in front of the hollow portion; a pair of first and second printed circuit boards (31, 32) received in the receiving space, both the pair of printed circuit boards having mating interfaces extending into the mating port and mounting portions located within the hollow portion; a spacer (4) interposed between the pair of first and second printed circuit boards (31, 32), said spacer (4) cooperating the housing (10) to fix the pair printed circuit boards within the receiving space; a plurality of cables (7) separated into two groups and coupled to the mounting portions of the pair of first and second printed circuit boards, respectively. The two group of cables offset from one another along a vertical direction and extend rearward from the housing.

20 Claims, 6 Drawing Sheets

_US 7,651,341 B2_

CIRCUIT BOARD ASSEMBLY WITH STAGGERED CABLE ARRANGEMENT

CROSS-REFERENCE TO RELATED APPLICATION

This application is related to a copending application entitled "Electrical Connector with Dual-interface", which has the same applicant and assignee as the present invention. The disclosure of the above identified application is incorporated herein by reference.

FIELD OF THE INVENTION

The present invention generally relates to a cable assembly, and more particularly to a cable assembly with staggered cable arrangement facilitating manufacture process.

DESCRIPTION OF PRIOR ART

PCI Express, officially abbreviated as PCI-E or PCIe, is a computer expansion card interface format introduced by Intel in 2004. It was designed to replace the general-purpose PCI expansion bus, the high-end PCI-X bus and the AGP graphics card interface. Unlike previous PC expansion interfaces, rather than being merely a bus, it is configured around point-to-point full duplex serial links called lanes. In PCIe 1.1 (the most common version as of 2007) each lane carries 250 MB/s in each direction.

PCI Express External Cabling which extends the PCI Express interconnects architecture "outside the box." Cables using the PCIe technology will be used for external applications, as well as applications internal to an enclosure that need a cable connection. PCI Express External Cabling Specification, REV. 1.0 introduced four kinds of cable assemblies x1, x4, x8 and x16, and among which the x16 cable assembly may reach highest transmitting rate. The x16 cable assembly includes a housing, a pair of stacked PCBs accommodated in a space of the housing and four cables terminated to corresponding the PCBs. However, as the space of the housing is limited, which may be difficult to arrange printed circuit boards and cables therein.

Hence, an improved cable assembly is highly desired to overcome the aforementioned problems.

SUMMARY OF THE INVENTION

Accordingly, an object of the present invention is to provide a cable assembly having staggered cable arrangement facilitating interconnection between cables and a connector.

In order to achieve the object set forth, a cable assembly in accordance with the present invention comprises a housing including a first shield part assembled to a second shield part to form a receiving space, said receiving space including a hollow portion and a mating port located in front of the hollow portion; a pair of first and second printed circuit boards received in the receiving space, both the pair of printed circuit boards having mating interfaces extending into the mating port and mounting portions located within the hollow portion; a spacer interposed between the pair of first and second printed circuit boards, said spacer cooperating the housing to fix the pair printed circuit boards within the hollow portion; a plurality of cables separated into two groups and coupled to the mounting portions of the pair of first and second printed circuit boards, respectively; and wherein the two group of cables offset from one another along a vertical direction and extend rearward from the housing.

Other objects, advantages and novel features of the invention will become more apparent from the following detailed description when taken in conjunction with the accompanying drawings.

DETAILED DESCRIPTION OF PREFERRED EMBODIMENTS

Reference will now be made in detail to the preferred embodiment of the present invention.

Figure 1:
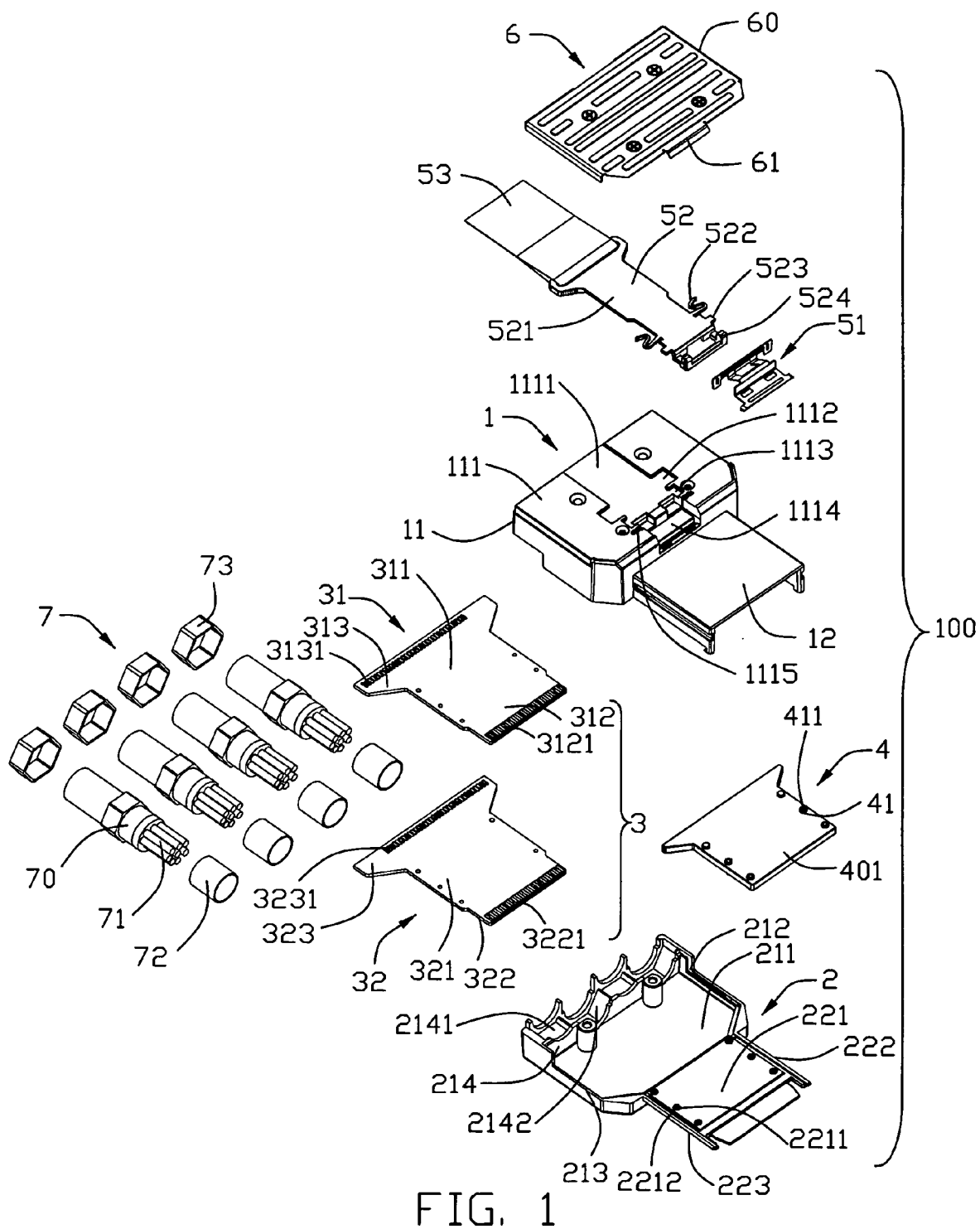
FIG. 1 is an exploded, perspective view of a cable assembly in accordance with the present invention.
Figure 2:
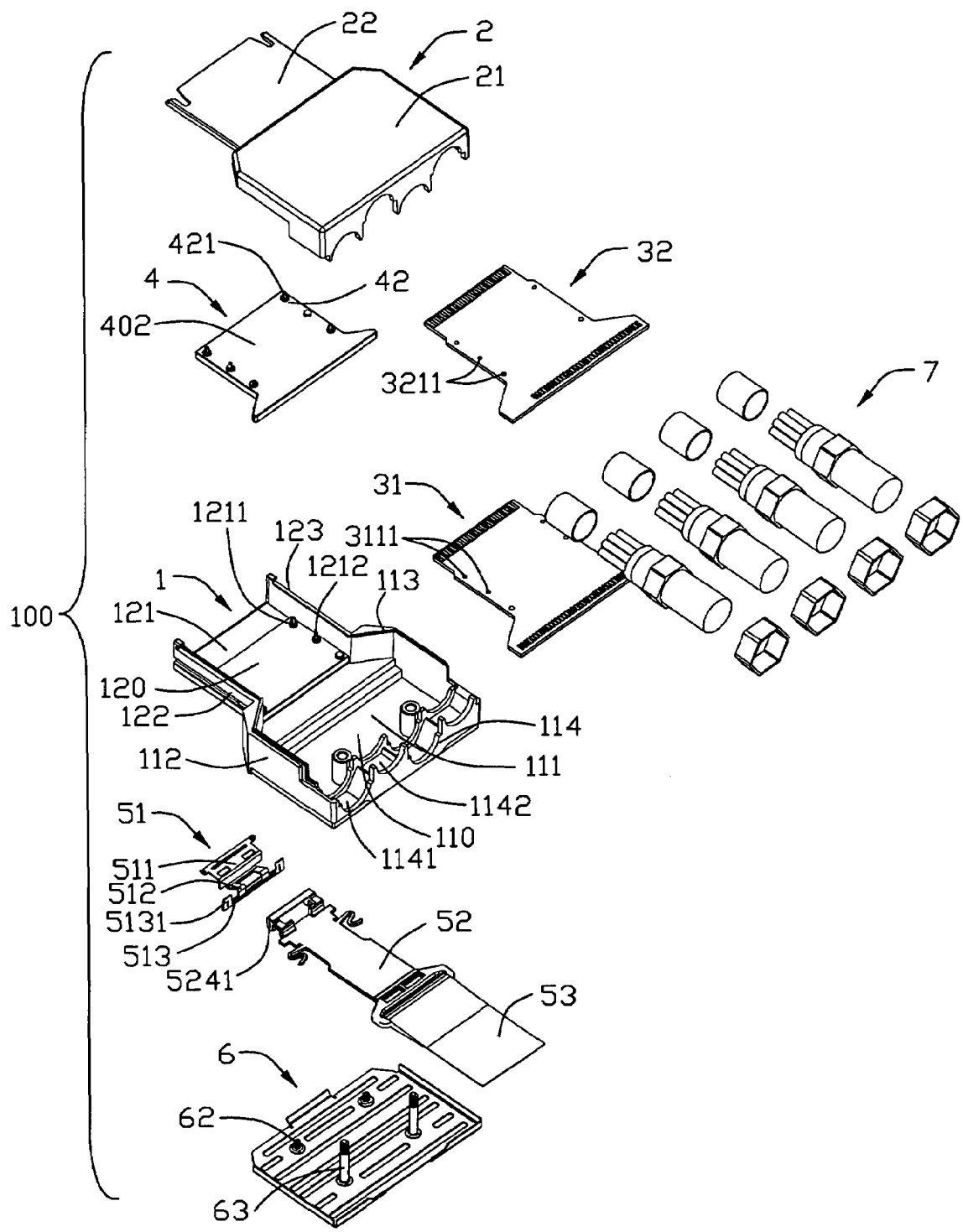
FIG. 2 is similar to FIG. 1, but viewed from another aspect.
Figure 3:
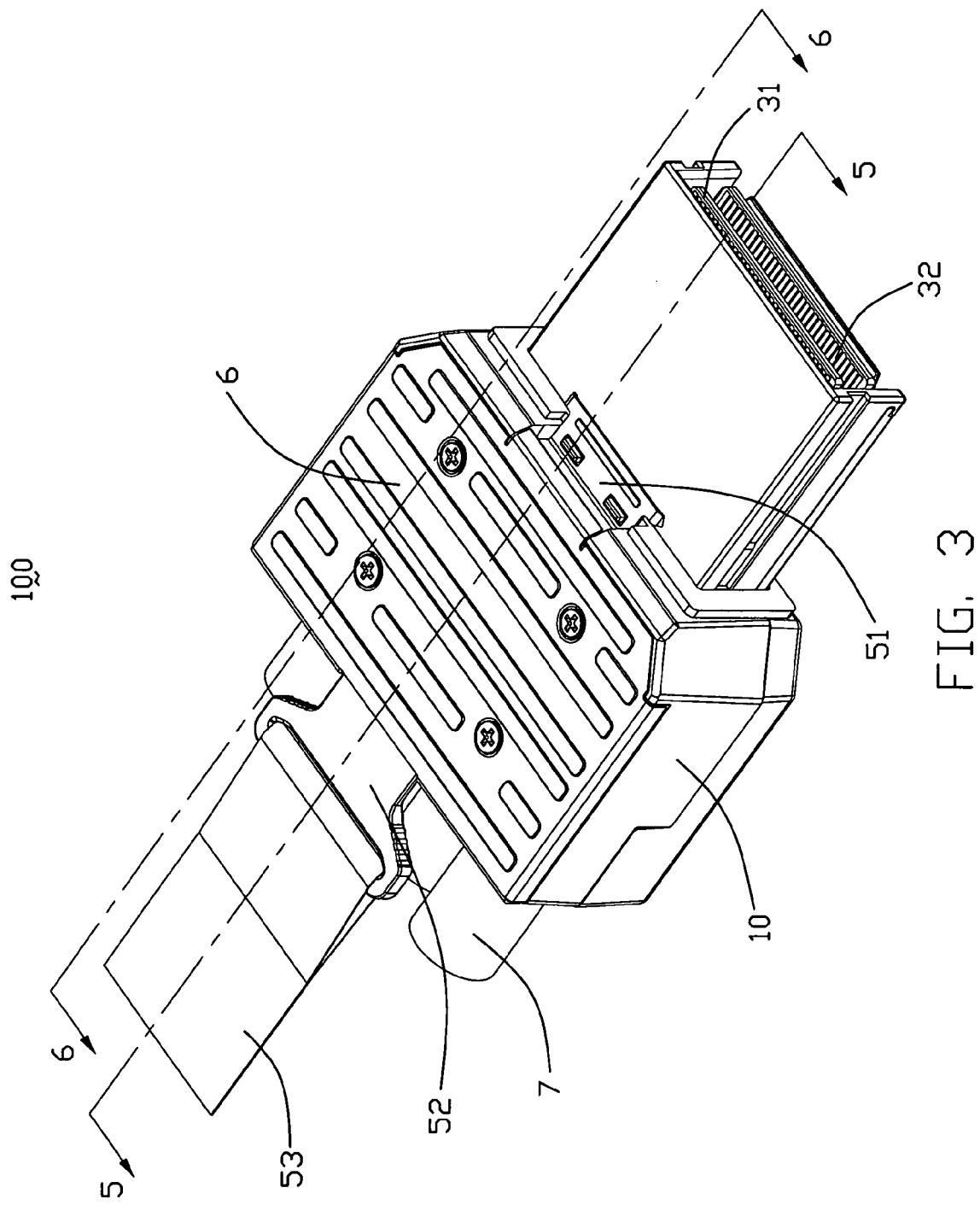
FIG. 3 is an assembled, perspective view of the cable assembly.
Figure 4:
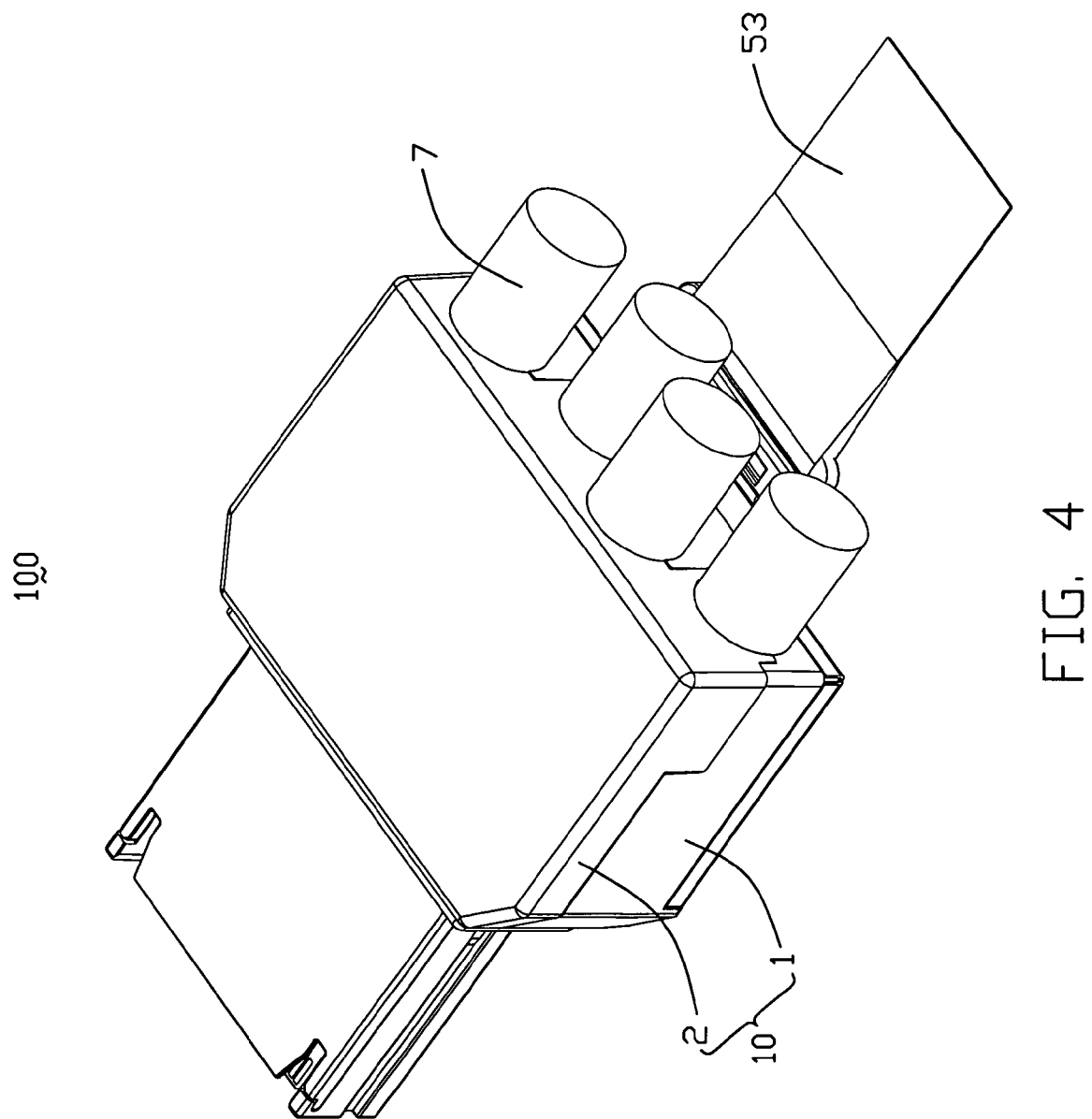
FIG. 4 is similar to FIG. 3, but viewed from another aspect.
Figure 5:
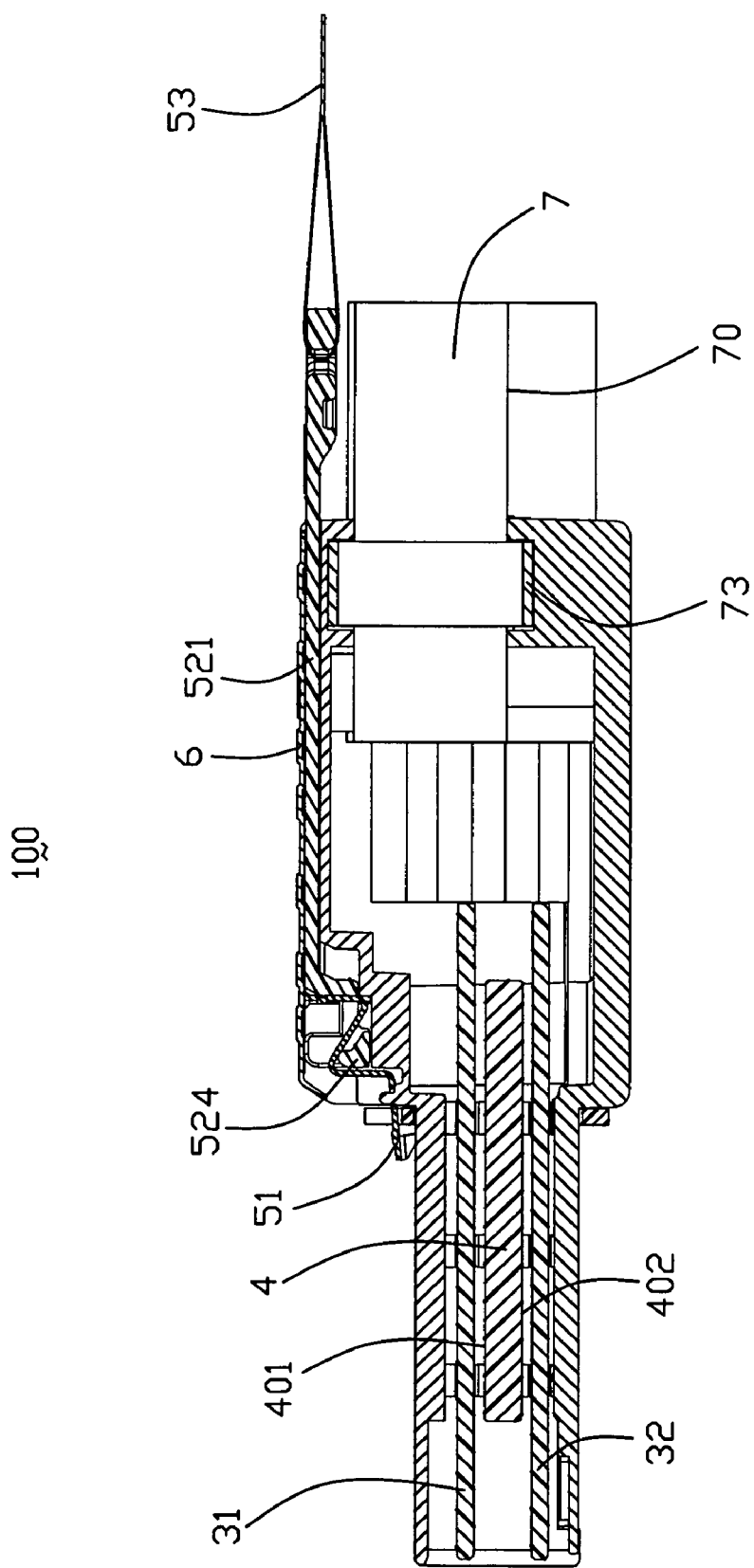
FIG. 5 is a cross-section view taken along line 5-5 of FIG. 3.
Figure 6:
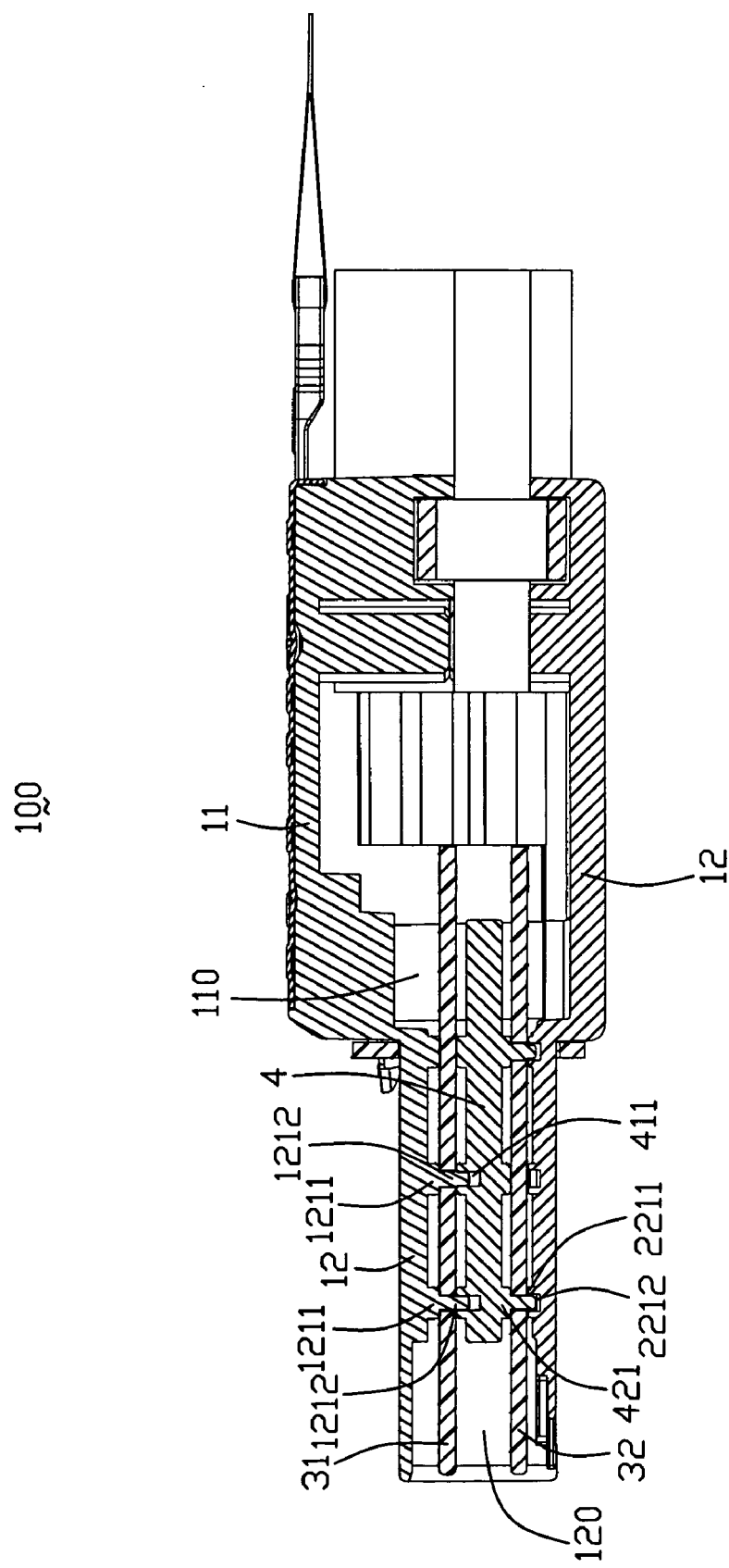
FIG. 6 is a cross-section view taken along line 6-6 of FIG. 3.

Referring to FIGS. 1-6, a cable assembly 100 in accordance with the present invention comprises a housing 10 having a upper first shield part 1 and a lower second shield part 2 together enclosing a receiving space (not numbered) therein, a pair of printed circuit boards (PCBs) 3 received in the receiving space, a spacer 4 interposed between the pair of the printed circuit boards 3, and four cables 7 coupled to the pair of PCBs 3.

The first shield part 1 comprises an expanded first base portion 11 and a relative slim first mating portion 12 extending forwardly from a front edge of the first base portion 11. The first base portion 11 has a top wall 111, a pair of side walls 112, 113 and a rear wall 114 forming a hollow portion 110. Four cavities 1141, 1142 are defined in a rear wall 114 and arranged in a row along transversal direction. These four cavities 1141, 1142 may be separated into two groups, and the first group cavities includes a first and third cavities 1141 (or the odd numbered cavity), the second group cavities includes a second and fourth cavities 1142 (or the even numbered cavity). The first cavity 1141 is deeper than the second cavity 1142. The first mating portion 12 has a top side 121, a pair of transversal sides 122, 123 forming a mating port 120 located in front of and communicating with the hollow portion 110. Two pair of position posts 1211 are spaced apart each other and arranged at lateral sides of the top side 121 and each of them further has a tiny stub 1212 formed thereon.

The upper portion of the top wall 111 defines a first channel portion 1111 arranged in a middle section thereof and a lower second channel portion 1114 in front of and communicating with the first channel portion 1111. A pair of first grooves 1112 are located in the middle section of the top wall 111 and further communicates with the first channel portion 1111. Two second grooves 1113 are in front of the first grooves 1112 and also communicates with the first channel portion 1111. A pair of slots 1115 are recessed downwardly from a top surface of a front section of the top wall 111 and communicates with the second channel portion 1114.

The second shield part 2 comprises a second base portion 21 and a second mating portion 22 extending forwardly from a front edge of the second base portion 21. The second base portion 21 has a bottom wall 211, a pair of side walls 212, 213 and a rear wall 214 extending upwardly from lateral edges and rear edge of the bottom wall 211. Four cavities 2141, 2142 are defined in a rear wall 214 and arranged in a row along transversal direction. The four cavities 2141, 2142 may be separated into two groups, and the first group cavities includes a first and third cavities 2141, the second group cavities includes a second and a fourth cavities 2142. The first cavity 2141 is shallower than the second cavity 2142. A structure of first or third cavity 2141 is same as the second or fourth cavity 1141 of the rear wall 114, and a structure of second or fourth cavity 2142 is same as the first or third cavity 1141 of the rear wall 114. The four cavities 1141, 1142 of the rear wall 114 cooperating with corresponding cavities 2141, 2142 of the rear wall 214 to form four cable exit outlets (not numbered). Therefore, the cable exit outlets are separated into two groups and further staggered in a rear wall (not numbered) of the housing 10. The first mating portion 22 has a bottom side 221, a pair of flanges 222, 223 formed at lateral edges of the bottom side 221. Two pair of support members 2211 are respectively arranged at lateral sides of the bottom side 221 and each of them further defines a hole 2212 therein.

The pair of PCBs 3 includes a first PCB 31 and a second PCB 32. Both the first and second PCBs 31, 32 have includes middle portions 311, 321, narrower front portions 312, 322 and broader rear portions 313, 323. A group of first conductive pads 3121 arranged on the front portion 312 to form a first mating interface and a set of second conductive pads 3131 arranged on the rear portion 313 of the substrate 310 to from a first mounting portion. The set of second conductive pads 3131 are proximate left side of the rear portion 313. An imaginary geometric central line (not shown) of the group of first conductive pads 3121 does not pass through geometric center of the set of second conductive pads 3131, thus the group of first conductive pads 3121 offset the set of second conductive pads 3131 along a longitudinal direction. Similarly, a group of first conductive pads 3221 arranged on the front portion 322 to form a second mating interface and a set of second conductive pads 3231 arranged on the rear portion 323 of the substrate 320 to from a second mounting portion. The set of second conductive pads 3231 are proximate right side of the rear portion 323. An imaginary geometric central line (not shown) of the group of first conductive pads 3221 does not pass through geometric center of the set of second conductive pads 3231, thus the group of first conductive pads 3221 offset the set of second conductive pads 3231 along a longitudinal direction. Thus, when the first and second PCBs 31, 32 are accommodated in the space of the housing 10, the group of first conductive pads 3121 of the first PCB 31 align with the group of first conductive pads 3221 of the second PCB along a vertical direction, while the set of second conductive pads 3131 of the first PCB 31 offset the set of second conductive pads 3231 of the first PCB 32 along a vertical direction. A distance between two adjacent first conductive pads 3121 is narrower than a distance between two adjacent second conductive pads 3131. Two pair of first through holes 3111 are respectively defined in lateral sides of the middle portion 311 of the a first PCB 31, and two pair of second through holes 3211 are respectively defined in lateral sides of the middle portion 321 of the second PCB 32, either.

The spacer 4 defines an upper surface 401 and an opposite lower surface 402. Two pairs of first protrusion members 41 extend upwardly from the upper surface 401 of the spacer 4 and each has a cavity 411 therein. Another two pairs of second protrusion members 42 extend downwardly from the lower surface 402 of the spacer 4 either, and each second protrusion member 42 has a post 421 formed thereon.

Each of the cables 7 includes a number of wires 71 and an insulated jacket 70 enclosing thereon. A circular-shaped inner ring member 72 is inserted into an interior portion of the insulated jacket 70 of a front portion the cable 7 to serve as a strain relief, and a hexagon-shaped outer ring 73 is crimped to a front portion of the cable 7, disposed outside of the inner ring member 72. The outer ring 73 is arranged into corresponding cavities 1141/1142 and 2141/2142 in the cable exit outlet of the rear wall to retain the cable 7 with the housing 10.

An optional latch mechanism 5 is assembled to the housing 10 of the cable connector 100. The latch mechanism 5 includes a latch member 51, an actuator 52 and a pull tape 53 attached to a rear portion of the actuator 52. The actuator 52 has a main body 521 received in the first channel portion 1111, a pair claw-shaped spring member 522 arranged at lateral sides of a front segment of the main body 521 and received in the first grooves 1112, a pair of stopper 523 disposed in front of the pair of claw-shaped spring member 522 and arranged at the lateral sides of the main body 521 and received in the second grooves 1113, an engaging portion 524 formed at a front end of the actuator 521 and received in the second channel portion 1114. The latch member 51 has a latch portion 511 disposed above first mating portion 12 of the housing 10, an engage segment 513 attached to the first base portion 11, with a pair of ear portions 5131 thereof interferentially received in the pair of slots 1115 of the first base portion 11, an N-shaped interconnecting portion 512 disposed above the engaging portion 524 of the actuator 52.

When assembly, the wires 71 of the cables 7 are soldered to the second conductive pads 3131, 3231 of the first and second PCBs 31, 32, then the first PCB 31 is assembled to the first shield part 1 and supported by the pair of position posts 1211, with the tiny stubs 1212 penetrate the two pair of first through holes 3111 of the first PCB 31, the first mating interface extending into the mating port 120 and the rear portion 313 located in the hollow portion 110. Secondly, the spacer 4 is disposed on the first PCB 31, with distal parts of the tiny stubs 1212 inserted into cavities 411 of the first protrusion members 41 thereof. Thirdly, the second PCB 32 is laid disposed on the spacer 4 and supported by second protrusion members 42 thereof, with the tiny posts 421 of the protrusion members 42 passing the pair of second through holes 3211. Fourthly, the second shield part 2 is assembled to the first shield part 1, with the support members 2211 thereof pressed onto the PCB 32 and the tiny posts 421 of the spacer 4 inserted into holes 2212 of the support members 2211. Fifthly, the latch mechanism 5 is assembled to the first shield part 1. Sixthly, a cap member 6 is assembled to the first shield part 1 to fix the latch mechanism 5, with a main portion 60 of the cap member 6 shielding the first base portion 11, a spring member 61 formed at a front edge thereof pressing onto the latch portion 511. A pair of first bolts 62 and a pair of second bolts 63 are assembled to the first and second shield parts 1, 2 to combine them together with the cap member 6. As the sets of second conductive pads 3131, 3213 of the first and second PCBs 31, 32 offset from one another, and cable exit outlets of the housing 10 are staggered and arranged at different levels, by such proper design, it is easily to arrange the cables 7 and the PCBs 3 in the limited space within the housing 10. Further more, the PCBs 3 are assembled to the housing 10 easily by utilizing the spacer 4, and retention/retain means, such as position posts 1211, first protrusion members 41, etc. that applied to fix the printed circuit boards 3 to housing 10 is not limited to the structure as described in the embodiment, another alternative structure is also available.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

The invention claimed is:

1. A circuit board assembly with staggered cable arrangement, comprising:
   a housing including a first shield part assembled to a second shield part to form a receiving space, said receiving space including a hollow portion and a mating port located in front of the hollow portion;
   a pair of first and second printed circuit boards received in the receiving space, both the pair of printed circuit boards having mating interfaces extending into the mating port and mounting portions located within the hollow portion;
   a spacer interposed between the pair of first and second printed circuit boards, said spacer cooperating with the housing to fix the pair of printed circuit boards within the receiving space;
   a plurality of cables separated into two groups and coupled to the mounting portions of the pair of first and second printed circuit boards, respectively; and
   wherein the two group of cables are offset from one another along a vertical direction and extend rearward from the housing;
   wherein a support member formed on the second shield part supports the second printed circuit board, and the spacer has at least one protrusion member contacting the second printed circuit board, wherein a post is formed on the protrusion member extending through the second printed circuit board and inserted into a hole in the support member.

2. The circuit board assembly with staggered cable arrangement as recited in claim 1, wherein at least another protrusion member formed on an opposite side of the spacer to support the first printed circuit board, and the first shield part has a position past contacting the first printed circuit board, wherein a stub is formed on the position post extending through said first printed circuit board and inserted into a cavity in the another protrusion member.

3. The circuit board assembly with staggered cable arrangement as recited in claim 1, wherein the spacer and the pair of the printed circuit boards are separated from and parallel to each other.

4. The circuit board assembly with staggered cable arrangement as recited in claim 3, wherein a group of first conductive pads arranged on a front segment of the printed circuit board form the mating interface, and wherein a set of second conductive pads arranged on the rear segment of the printed circuit board form the mounting portions.

5. The circuit board assembly with staggered cable arrangement as recited in claim 4, wherein the first conductive pads of the first printed circuit board align with the first conductive pads of the second printed circuit board along a vertical direction.

6. The circuit board assembly with staggered cable arrangement as recited in claim 4, wherein the second conductive pads of the first printed circuit board are offset from the second conductive pads of the second printed circuit board along a vertical direction.

7. The circuit board assembly with staggered cable arrangement as recited in claim, wherein a distance between two adjacent first conductive pads is narrower than a distance between two adjacent second conductive pads.

8. A circuit board assembly with staggered cable arrangement, comprising:
   a housing enclosing a receiving space including a hollow portion and a mating port disposed in front of the hollow portion;
   a pair of first and second printed circuit boards apart from one another alohg a vertical direction, said pair of first and second printed circuit boards having mating interfaces extending into the mating port and mounting portions located within the hollow portion, and said mounting portions of the first and second printed circuit boards offset one another, rather than aligning with one another along a vertical direction; and
   wherein at least two cables are arranged at different levels at a rear wall of the housing and electrically connecting to the mounting portions of the first and second printed circuit boards, respectively;
   a spacer arranged between the first and second printed circuit boards, engaging means formed on the spacer and the housing to position the first and the second printed circuit boards, the spacer detachable from the pair of first and second circuit boards and the cables.

9. The circuit board assembly with staggered cable arrangement as recited in claim 8, wherein the engaging means is a post formed on the spacer or the housing and a corresponding cavity defined in the housing or the spacer; wherein the post passes via a through hole defined in the first or second printed circuit and inserts into the cavity.

10. The circuit board assembly with staggered cable arrangement as recited in claim 8, wherein a group of first conductive pads arranged on a front segment of the printed circuit board to form the mating interface, and wherein a set of second conductive pads arranged on the rear segment of the printed circuit board to form the mounting portion.

11. The circuit board assembly with staggered cable arrangement as recited in claim 10, wherein the first conductive pads of the first printed circuit board align with the first conductive pads of the second printed circuit board along a vertical direction.

12. The circuit board assembly with staggered cable arrangement as recited in claim 10, wherein the second conductive pads of the first printed circuit board are offset from the second conductive pads of the second printed circuit board along a vertical direction.

13. The circuit board assembly with staggered cable arrangement as recited in claim 10, wherein a plurality of cable exit outlets are defined in the rear wall of the housing.

14. The circuit board assembly with staggered cable arrangement as recited in claim 13, wherein odd numbered cable exit outlets are lower than even numbered cable exit outlets viewed from a rear direction.

15. The circuit board assembly with staggered cable arrangement as recited in claim 14, wherein the odd numbered cable exit outlets and the even numbered cable exit outlets are of staggered relationship.

16. The circuit board assembly with staggered cable arrangement as recited in claim 15, wherein a group of cables extend into the odd numbered cable exit outlets to electrically connect mounting portions of the first printed circuit board, wherein another group of cables extend into the even numbered cable exit outlets to electrically connect mounting portions of the second printed circuit board.

17. A circuit board assembly with staggered cable arrangement comprising:
   a housing defining a mating port;
   first and second printed circuit boards each extending in a transverse direction, said first and second printed circuit boards disposed in said mating port at two different levels along a vertical direction and in a parallel relation with each other;
   a first set of cable linked to a rear region of the first printed circuit board; and a second set of cable linked to a rear region of the second printed circuit board; wherein said first set of cable and said second setoff cable are essentially located at said two different levels; wherein the housing defines in a rear wall thereof upper level and lower level cavities so as to allow the first set of cable and the second set of cable to respectively extend rearward and outward under condition that said first set of cable and said second set of cable are not overlapped with each other in said vertical direction.

18. The circuit board assembly with staggered cable arrangement as recited in claim 17, wherein the first and second printed circuit boards respectively have a plurality of conductive pads located on rear portions thereof, the first printed circuit board forming the conductive pads proximate a left side of the rear portion thereof while the second printed circuit board forming the conductive pads proximate a right side of a rear portion thereof.

19. The circuit board assembly with staggered cable arrangement as claimed in claim 18, wherein the first set of cable includes a plurality of first wires and the second set of cable includes a plurality of second wires alternately ranged with said first wires.

20. The circuit board assembly with staggered cable arrangement as recited in claim 19, wherein the housing includes upper and lower parts cooperating with each other to sandwich each of said first wires and said second wires therebetween.

* * * * *